United States Patent [19]
Brown et al.

[11] Patent Number: 5,547,887
[45] Date of Patent: Aug. 20, 1996

[54] METHOD OF MAKING A CMOS OUTPUT PAD DRIVER WITH VARIABLE DRIVE CURRENTS, ESD PROTECTION AND IMPROVED LEAKAGE CURRENT BEHAVIOR

[75] Inventors: Charles A. Brown; George C. Rleck, both of Corvallis, Oreg.; Charles E. Moore, Loveland, Colo.

[73] Assignee: Hewlett-Packard Company, Palo Alto, Calif.

[21] Appl. No.: 413,055

[22] Filed: Mar. 28, 1995

Related U.S. Application Data

[62] Division of Ser. No. 91,705, Jul. 14, 1993, Pat. No. 5,436,578.

[51] Int. Cl.⁶ .............................. H01L 21/70; H01L 27/00
[52] U.S. Cl. .............................. 437/51; 437/60; 437/250; 437/948
[58] Field of Search .......................... 437/51, 250, 948, 437/50, 29, 59, 8, 60, 47; 148/DIG. 103–106

[56] References Cited

U.S. PATENT DOCUMENTS

| | | | |
|---|---|---|---|
| 4,893,168 | 1/1990 | Takahashi et al. | 437/50 |
| 5,290,724 | 3/1994 | Leach | 437/51 |
| 5,399,517 | 3/1995 | Ashtaputre et al. | 437/51 |

*Primary Examiner*—H. Jey Tsai

[57] ABSTRACT

A configurable circuit for driving an integrated circuit output pad includes two differently-sized arrays of p-channel FETs and two arrays of differently-sized n-channel FETs for driving the pad. A circuit designer selects different ones of the FETs to produce a desired level of n-channel and p-channel drive at the pad. The nonselected p-channel FETs are maintained in a disabled condition by tying them off to one side of a p-channel FET which is also connected to a n-type island in a substrate in which the circuit is formed. Electrostatic charge is drained from the gates of the disabled FETs through the n-type island when power is not applied to the integrated circuit thereby preventing failure of leakage tests. The nonselected n-channel FETs are similarly tied to one side of an n-channel FET which in turn is tied to a p-type island to achieve the same purpose for the n-channel FETs. A photolithographic mask embodying a configurable circuit is provided to a designer who utilizes a CAD program to lay down polysilicon connections to select the drive transistors and disable the nonselected transistors.

9 Claims, 2 Drawing Sheets

METHOD OF MAKING A CMOS OUTPUT PAD DRIVER WITH VARIABLE DRIVE CURRENTS, ESD PROTECTION AND IMPROVED LEAKAGE CURRENT BEHAVIOR

CROSS REFERENCE TO RELATED APPLICATION(S)

This is a divisional of application Ser. No. 08/091,705 filed on Jul. 14, 1993, U.S. Pat. No. 5,436,578.

BACKGROUND OF THE INVENTION

1. Field of the Invention

The present invention relates generally to a circuit for driving an integrated circuit (IC) output pad and more particularly to such a circuit which is configurable to effect different levels of output current drive. The present invention also relates generally to a method for making such a circuit.

2. Description of the Related Art

Output and input/output pads in integrated circuits are typically designed to provide a particular level of output current drive. When a different level of drive is needed, a new pad is designed. This approach requires a new pad design each time a different level of pad drive current is needed. In an effort to reduce pad design time, configurable circuits for driving an IC output pad were developed. One such circuit includes a plurality of field effect transistors (FETS) which are connected together in parallel. Typically there are two arrays of such FETs, one comprising an array of n-channel FETs connected together in parallel and the other comprising an array of p-channel FETs also connected together in parallel. One side of the n-channel FETs is connected to the pad and the other is grounded to provide sourcing drivers. One side of the p-channel FETs is also connected to the pad with the other side being connected to a power supply to provide sinking drivers.

Such a circuit for driving an IC output pad is embodied in a photolithographic mask formed by a prior art computer program. A circuit designer can then create additional artwork, utilizing the computer program, which adds connections to the circuit that tie off the gates of some of the FETs, thereby maintaining them in a permanently off condition, and that tie together the gates of the remaining FETs for driving the output pad responsive to a drive signal provided by the integrated circuit.

Tieing off the unused FETs directly to ground, in the case of n-channel FETs, or to a power supply, in the case of p-channel FETs, compromises electrostatic discharge (ESD) protection in that the tied-off FETs punch thru at different voltages from the FETs which are not tied off. This causes the group which punches thru first to absorb most of the energy of any ESD.

It is known in the art to tie off FETs by connecting the gates of the tied-off FETs to one side of another FET which is always in an on condition when voltage is applied to the IC. This improves ESD protection for the configurable circuit. However, when tied-off FETS are connected to one side of another FET, problems arise during IC testing before power is applied to the IC. Charge can build up on the gates of the tied-off FETs to a level which causes them to turn on thus causing leakage tests to fail.

In addition, such prior art circuits provide relatively coarse adjustment of how much drive current is provided. It would be desirable to provide finer resolution of the level of output current provided at the pad and to overcome problems associated with leakage testing of the above-described prior an circuit.

SUMMARY OF THE INVENTION

A circuit for driving an IC output pad includes an array of driver transistors. Some of the transistors are tied off and some are selected for driving to produce an output signal on the pad. The nonselected transistors are connected to one side of a tie-off transistor for maintaining the nonselected transistors in an off condition. Means are provided for preventing the potential on the tie-off transistor from rising above a preselected level when the tie-off transistor is turned off.

In another aspect of the present invention, the array of driver transistors includes transistors of at least two different sizes. In still another aspect of the invention, a method is provided for making a photolithographic mask which is utilized in making the circuit of the present invention.

It is a general object of the present invention to provide a circuit for driving an IC output pad which overcomes the disadvantages associated with prior art circuits.

It is a more specific object of the present invention to provide such a circuit which permits a designer to configurate the circuit to obtain relatively fine resolution of the desired level of output drive current.

It is another more specific object of the present invention to provide such a circuit which prevents electrostatic charge from turning on the tied-off FETs.

It is another general object of the present invention to provide a method for making a circuit for driving an IC output pad.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENT

Figure 1:
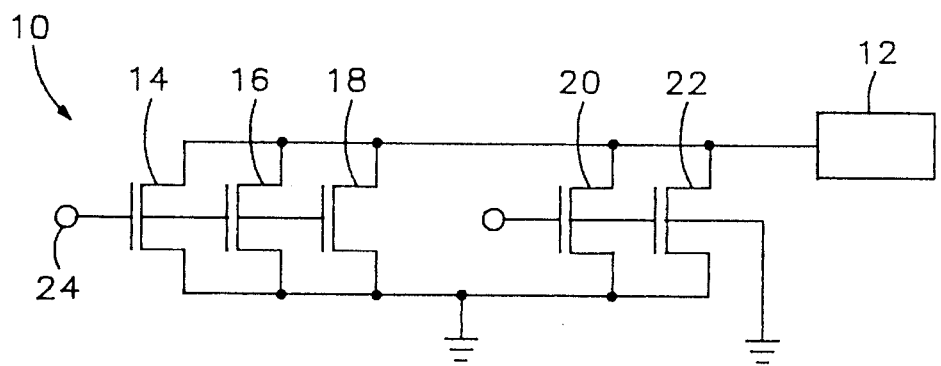
FIG. 1 is a schematic diagram of a prior art circuit for driving an IC output pad.

Turning now to FIG. 1, indicated generally at 10 is a prior art circuit for driving an IC output pad 12. Circuit 10 is embodied in an integrated circuit. Included in circuit 10 are FETs 14, 16, 18, 20, 22. The gates of FETs 20, 22 are grounded as shown and the gates of FETs 14, 16, 18 are connected to a node 24 which in turn is connected to a logic gate (not shown) that produces output signals developed by a circuit (also not shown) embodied in the IC.

FETs 20, 22, although not needed for increasing the current drive at pad 12 over and above that provided by FETs 14, 16, 18, are provided to increase the total width of FETs 14–22 to improve ESD protection. While providing the additional FETs does increase ESD protection, tieing off some (FETs 20, 22) and driving others (FETs 14, 16, 18) creates different punch thru voltages for FETs 14, 16, 18, on the one hand, and FETs 20, 22, on the other hand. This condition causes the group which punches thru first to absorb most of the ESD energy.

Figure 2:
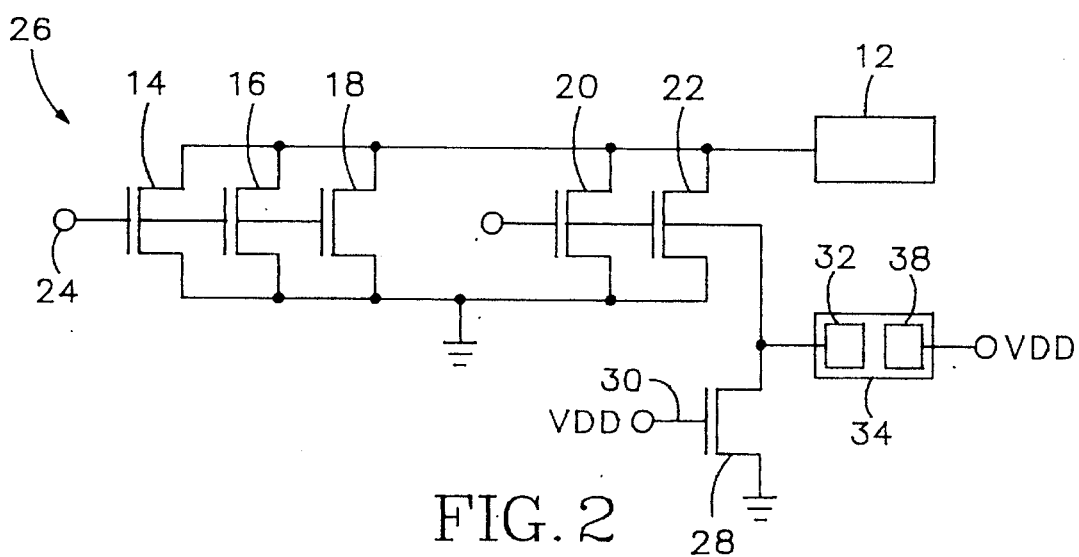
FIG. 2 is a schematic diagram of a first embodiment of a circuit for driving an IC output pad constructed in accordance with the present invention.

Turning now to FIG. 2 and indicated generally at 26 is a circuit constructed in accordance with the present invention. Structure corresponding to that previously described in FIG. 1 retains the same numeral in FIG. 2. Circuit 26 includes a tie-off FET 28, also an n-channel FET like FETs 14–22. FET 28 includes a gate 30 which is connected to VDD, a +5 volt power supply, as shown. Tieing FETs 20, 22, which are thereby disabled, to one side of tie-off FET 28 tends to equalize the punch thru voltages of FETs 14–18 and FETs 20, 22 and thus improves ESD performance relative to circuit 10 in FIG. 1.

Figure 3:
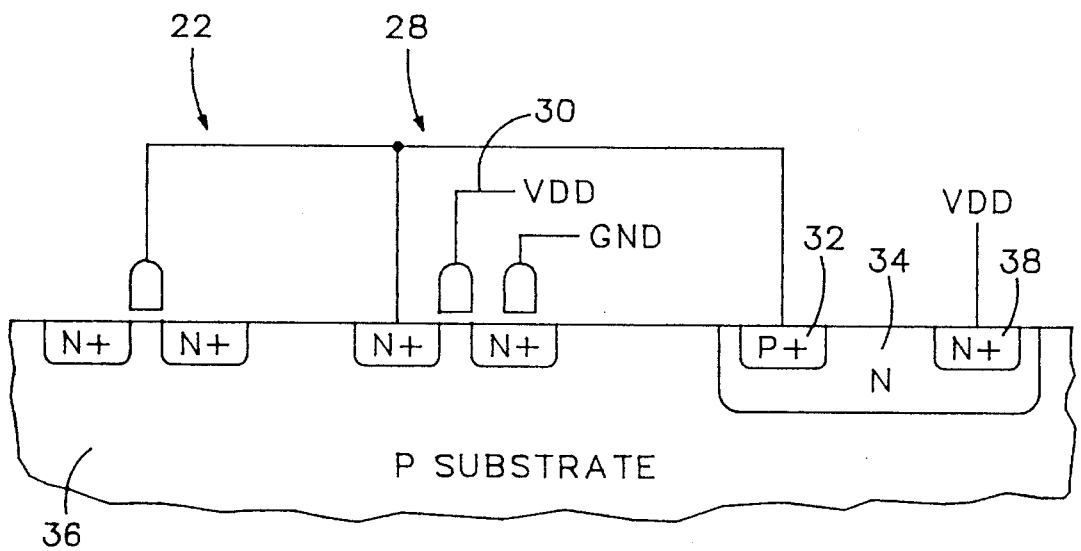
FIG. 3 is a schematic diagram of a portion of a semiconductor embodying the circuit of FIG. 2.

In accordance with the present invention, one side of FET 28 is connected to p-type island 32. With reference to FIG. 3, it can be seen that p-type island 32 is formed in an n-type well 34 which is diffused into a p-type substrate 36. The remainder (not shown) of the IC is also formed in substrate 36. Well 34 includes an n-type island 38 to facilitate a connection between the well and VDD, the +5 volt DC power supply. Without a p-type island 32, the circuit permits charge to build up on the common gates of FETs 20, 22 when power is not applied to the IC in which circuit 26 is embodied. If charge builds up to +2 volts or more, FETs 20, 22 turn on and thus cause leakage tests of the IC in which circuit 26 is embodied to fail.

Operation of circuit 26 in FIG. 2 will now be considered. When power is not applied to the IC in which circuit 26 is embodied, any charge accumulating on the common gates of FETs 20, 22 forward biases the junction between p-type island 32 and n-type well 34 thus draining the charge from the gates. This prevents a potential above that required to forward bias the junction between island 32 and well 34 from forming on the gates of FETs 20, 22. The potential required to forward bias the junction is just under that required to turn on FETs 20, 22. Thus, when power is not applied to the IC, FETs 20, 22 cannot be turned on and therefore do not cause leakage tests to fail as a result of being turned on when power is not applied to the IC.

When power is applied to the IC, VDD is applied to the n-type island 38 thereby reverse-biasing the junction between p-island 32 and n-type well 34. With VDD applied to gate 30 of FET 28, FETs 20, 22 are tied to ground via FET 28 which is how the designer selects the desired drive level he needs and no more or less.

Figure 4:
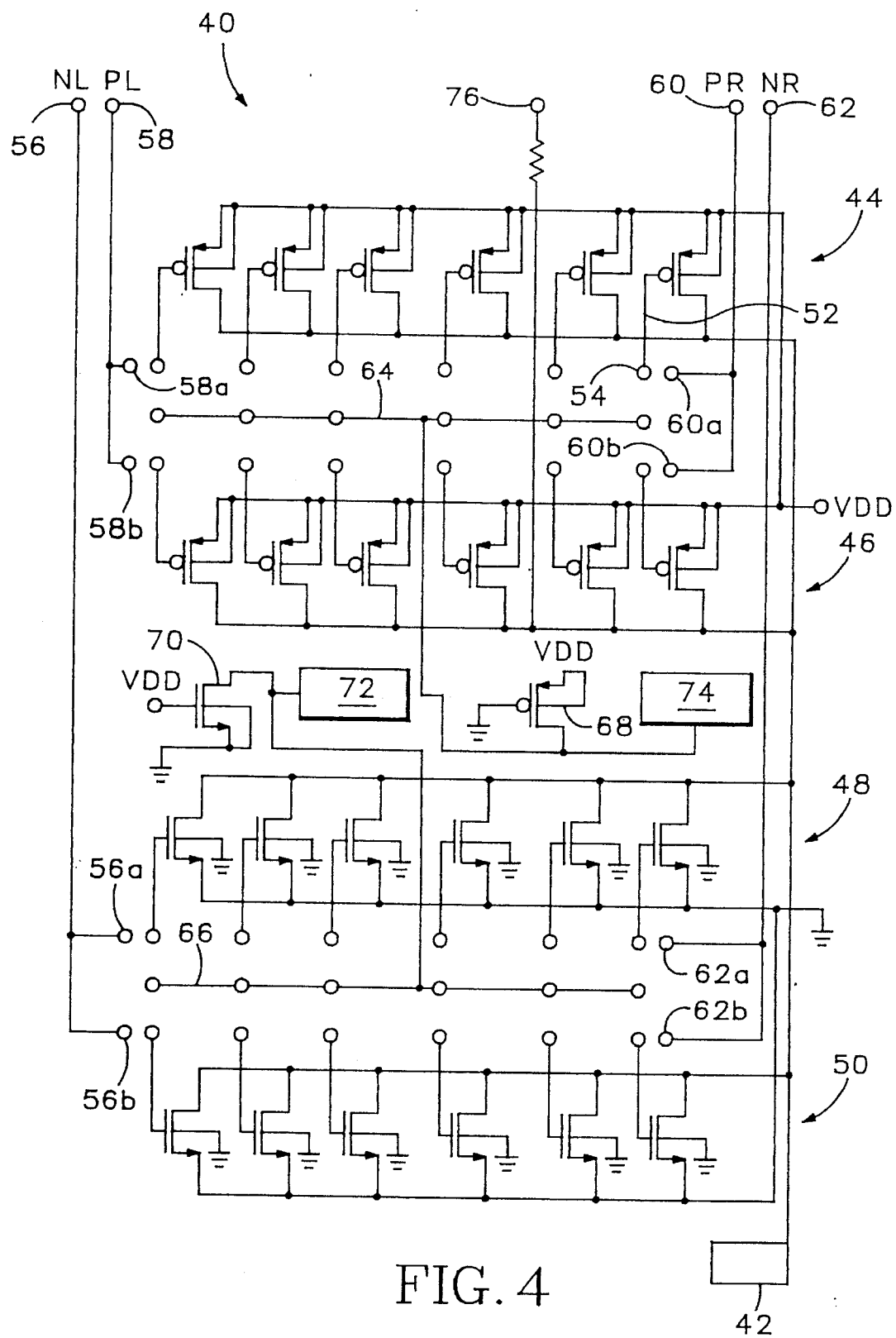
FIG. 4 is a schematic diagram of a second embodiment of a circuit, and of a photolithographic mask used to create the circuit, for driving an IC output pad constructed in accordance with the present invention.

Turning now to FIG. 4, indicated generally at 40 is a schematic diagram of a circuit, and of a photolithographic mask used to create the circuit, constructed in accordance with the present invention. Reference to circuit components herein should also be considered to refer to corresponding structure in a mask used to create an integrated circuit embodying the invention. Diagram 40 includes an IC output pad 42. The pad is drivable by first, second, third and fourth arrays, 44, 48, 46, 50, respectively, of FET driver transistors. Arrays 44, 46 comprise p-type channel FETs, which are referred to herein as FETs of a first polarity type. The n-type FETs in arrays 48, 50 are referred to herein as FETs of a second polarity type.

The FETs in array 44 are 54.4 microns wide by 1.6 microns in length, the FETs in array 46 are 34.4 microns wide by 1.6 microns in length, the FETs in array 48 are 62.4 microns wide by 1.6 microns long and the FETs in array 50 are 38.4 microns wide by 1.6 microns in length. As can be seen with reference to the following Table 1, different combinations of the FETs in arrays 44, 46 can be used to drive pad 42 to provide a total drive current as shown in the table. Similarly, different combinations of the FETs in arrays 48, 50 can be used to drive pad 42 to produce one of the current drive levels shown in the following Table 2. The manner in which the FETs in each of the arrays are selected or tied off is described hereinafter.

TABLE 1

| 54.40 | 34.40 | width | 54.40 | 34.40 | width |
|---|---|---|---|---|---|
| 0 | 0 | 0.0 u | 5 | 0 | |
| 0 | 1 | 34.4 u | 2 | 5 | 272.0 u |
| 1 | 0 | 54.4 u | 4 | 2 | 280.0 u |
| 0 | 2 | 68.8 u | 4 | 2 | 286.4 u |
| 1 | 1 | 88.8 u | 3 | 4 | 300.8 u |
| 0 | 3 | 103.2 u | 5 | 1 | 306.4 u |
| 2 | 0 | 108.8 u | 2 | 6 | 315.2 u |
| 1 | 2 | 123.2 u | 4 | 3 | 320.8 u |
| 0 | 4 | 137.6 u | 6 | 0 | 326.4 u |
| 2 | 1 | 143.2 u | 3 | 5 | 335.2 u |
| 1 | 3 | 157.6 u | 5 | 2 | 340.8 u |
| 3 | 0 | 163.2 u | 4 | 4 | 355.2 u |
| 0 | 5 | 172.0 u | 6 | 1 | 360.8 u |
| 2 | 2 | 177.6 u | 3 | 6 | 369.6 u |
| 1 | 4 | 192.0 u | 5 | 3 | 375.2 u |
| 3 | 1 | 197.6 u | 4 | 5 | 389.6 u |
| 0 | 6 | 206.4 u | 6 | 2 | 395.2 u |
| 2 | 3 | 212.0 u | 5 | 4 | 409.6 u |
| 4 | 0 | 217.6 u | 4 | 6 | 424.0 u |
| 1 | 5 | 226.4 u | 6 | 3 | 429.6 u |
| 3 | 2 | 232.0 u | 5 | 5 | 444.0 u |
| 2 | 4 | 246.4 u | 6 | 4 | 464.0 u |
| 4 | 1 | 252.0 u | 5 | 6 | 478.4 u |
| 1 | 6 | 260.8 u | 6 | 5 | 498.4 u |
| 3 | 3 | 266.4 u | 6 | 6 | 532.8 u |

TABLE 2

| 62.4 u | 38.40 u | width | 62.4 u | 38.40 u | width |
|---|---|---|---|---|---|
| 0 | 0 | 0.0 u (in only) | | | |
| 0 | 1 | 38.4 u | 5 | 0 | 312.0 u |
| 1 | 0 | 62.4 u | 2 | 5 | 316.8 u |
| 0 | 2 | 76.8 u | 4 | 2 | 326.4 u |
| 1 | 1 | 100.8 u | 3 | 4 | 340.8 u |
| 0 | 3 | 115.2 u | 5 | 1 | 350.4 u |
| 2 | 0 | 124.8 u | 2 | 6 | 355.2 u |
| 1 | 2 | 139.2 u | 4 | 3 | 364.8 u |
| 0 | 4 | 153.6 u | 6 | 0 | 374.4 u |
| 2 | 1 | 163.2 u | 3 | 5 | 379.2 u |
| 1 | 3 | 177.6 u | 5 | 2 | 388.8 u |
| 3 | 0 | 187.2 u | 4 | 4 | 403.2 u |
| 0 | 5 | 192.0 u | 6 | 1 | 412.8 u |
| 2 | 2 | 201.6 u | 3 | 6 | 417.6 u |
| 1 | 4 | 216.0 u | 5 | 3 | 427.2 u |
| 3 | 1 | 225.6 u | 4 | 5 | 441.6 u |
| 0 | 6 | 230.4 u | 6 | 2 | 451.2 u |
| 2 | 3 | 240.0 u | 5 | 4 | 465.6 u |
| 4 | 0 | 249.6 u | 4 | 6 | 480.0 u |
| 1 | 5 | 254.4 u | 6 | 3 | 489.6 u |
| 3 | 2 | 264.0 u | 5 | 5 | 504.0 u |
| 2 | 4 | 278.4 u | 6 | 4 | 528.0 u |
| 4 | 1 | 288.0 u | 5 | 6 | 542.4 u |
| 1 | 6 | 292.8 u | 6 | 5 | 566.4 u |
| 3 | 3 | 302.4 u | 6 | 6 | 604.8 u |

Each transistor array, like array 44, includes a connection from the gate of each FET in the array to a corresponding gate node, such as a connection 52 to gate node 54 in array 44. All of the gate nodes in each array are aligned to facilitate connection of the nodes as hereinafter described.

The circuit depicted in diagram 40 includes four input signals which enable selected ones of the transistors as will be shortly described. The input signals include an n-type, left-side signal (NL at node 56), a p-type, left-side signal (PL at node 58), a p-type, right-side signal (PR at node 60) and an n-type, right-side signal (NR at node 62). The n-type signals are provided to the n-channel FETs in arrays 48, 50 at nodes 56a, 56b, 62a, 62b while the p-signals are applied to the p-channel FETs in arrays 44, 46 at nodes 58a, 58b, 60a, 60b. The left-side signals are applied to the left side of all four arrays at nodes 58a, 58b, 56a, 56b while the right-side signals are applied to the right side of each array at nodes 60a, 60b, 62a, 62b. The signals are provided at nodes 56, 58, 60, 62 by circuitry (not shown) in the IC which drive the circuit in diagram 40 to produce a corresponding output signal on pad 42.

Tie-off lines 64, 66 are formed between the gate nodes in arrays 44, 46 and arrays 48, 50, respectively. Tie-off line 64 is connected to one side of a p-channel, tie-off FET 68 and tie-off line 66 is connected to one side of an n-channel, tie-off FET 70. One side of tie-off FET 70 is connected to a p-type island 72 and one side of FET 68 is connected to an n-type island 74. As will be seen, the circuit depicted in diagram 40 may be configured by connecting the gate nodes, on the mask corresponding to diagram 40, of selected ones of the transistors in arrays 48, 50 to tie-off line 66. When the mask, and thus the circuit, is so configured, the tied-off transistors in array 48, 50 are tied-off in the same manner as FETs 20, 22 in FIG. 2, i.e., each gate is connected to one side of a tie-down FET which in turn is connected to a p-type island. As in the circuit of FIG. 2, this structure prevents the tied-off FETs from being turned on as a result of electrostatic charge accumulation when power is not applied to the IC in which the circuit depicted in diagram 40 is embodied.

Tie-off FET 68 and related n-type island 74 serve the same function for the p-channel FETs in arrays 44, 46, i.e., when power is not applied to the IC, any negative charge accumulating on line 64 forward biases n-type island 74 relative to the p-type substrate, like that in FIG. 3, in which island 74 is formed. Such biasing prevents the potential on line 64 from reaching that sufficient to turn on the FETs in arrays 44, 46, which, as is described hereinafter, have selected ones of their gate nodes connected to tie-off line 64.

An input node 76 is provided for passing an input signal supplied to pad 42 to an input node of circuitry (not shown) embodied in the IC.

Integrated circuit designers generally utilize computer-aided design software packages for generating photolithographic masks which are in turn used in a known manner to construct an integrated circuit. Such software packages are commercially available and include design environment programs such as OPUS manufactured by Cadence and the FALCON design environment program manufactured by Mentor Graphics of Portland, Oreg. Diagram 40, which is also referred to herein as a base mask, is provided as a file in the computer program to a designer who configures the pad to produce a desired level of drive current at pad 42. With reference to Table 1, the designer first determines which of the obtainable current drive levels in Table 1 is most suitable. Then, the designer utilizes the computer program to generate a polysilicon connection in a straight line from nodes 58a, 60a and nodes 58b, 60b to connect the appropriate number of FETs in each of arrays 44, 46 to nodes 58, 60, respectively for driving the selected FETs to produce the selected current level in pad 42. The gate nodes of each of the nonselected FETs are tied directly to tie-off line 64 by creating a polysilicon connection between each gate and a corresponding opposite connection node on line 64. In the case where only a single drive level is desired from the p-channel FETs, the same drive signal is applied to nodes 58, 60 thus driving the selected FETs together. Alternatively, different drive signals can be applied to nodes 58, 60 thus permitting different levels of current drive to appear on pad 42 from arrays 44, 46.

Utilizing Table 2, FETs in arrays 48, 50 are selected to provide a desired level of current drive at pad 42 from the n-channel FETs. Polysilicon connections are made from nodes 56a, 56b and nodes 62a, 62b, each in a straight line, to connect a preselected number of the FETs in arrays 48, 50 to the enable signals appearing at nodes 56, 62. The nonselected FETs in arrays 48, 50 are connected with a polysilicon connection to tie-off line 66.

The present invention therefore provides a designer with the ability to finely resolve a desired level of output current drive at a pad without inadvertently comprising the ESD protection while preventing electrostatic charge from building up to a level of which could turn on one of the tied-off FETs when no power is applied to the integrated circuit.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A method for generating a photolithographic mask for an IC circuit for driving an IC output pad comprising the steps of:

creating said circuit by generating a base mask having:
- a first array of transistors of a first conductivity type connected to the output pad, and each transistor having a gate,
- a first island of a second conductivity type,
- a first tie-off transistor connected between the first island and a first supply voltage terminal for receiving a first supply voltage,
- a second array of transistors of the second conductivity type connected to the output pad and each transistor having a gate,
- a second island of the first conductivity type, and
- a second tie-off transistor connected between the second island and a second supply voltage terminal for receiving a second supply voltage;

determining a level of drive current for the output pad;

selecting a combination of transistors from the first and second arrays which together provide a level of drive current corresponding to said level of drive current for said output pad;

overlaying a first connection on the base mask which connects together the gates of selected transistors in the first array;

overlaying a second connection on the base mask which connects together the gates of selected transistors in the second array;

overlaying a third connection on the base mask which connects the gates of nonselected transistors in the first array to the first tie-off transistor; and overlaying a fourth connection on the base mask which connects the gates of nonselected transistors in the second array to the second tie-off transistor, wherein the tie-off transistors maintain the nonselected transistors in the first and second arrays in an off condition when power is applied to the IC and the first and second islands prevent leakage current from being produced by the output pad when power is not applied to the IC.

2. The method of claim 1 wherein the gates of the transistors in each of said arrays are connected to nodes which are aligned and wherein the steps of overlaying a first connection comprises the step of overlaying a straight connection onto the gates of the selected transistors.

3. The method of claim 1 wherein said base mask further includes:

a third array of transistors of the first conductivity type connected to the output pad and each transistor having a gate; and a fourth array of transistors of the second conductivity type connected to the output pad, and each transistor having a gate and wherein said method further comprises the steps of:

overlaying a fifth connection on the base mask which connects the together gates of selected transistors in the third array;

overlaying a sixth connection on the base mask which connects together the gates of selected transistors in the fourth array;

overlaying a seventh connection on the base mask which connects the gates of nonselected transistors in the third array to the first tie-off transistor: and overlaying an eighth connection on the base mask which connects the gates of nonselected transistors in the fourth array to the second tie-off transistor, wherein the tie-off transistors maintain the nonselected transistors in the third and fourth array in an off condition when power is applied to the IC and the first and second islands prevent leakage current from being produced by the output pad when power is not applied to the IC.

4. The method of claim 3 wherein the steps overlaying a first connection and overlaying a fifth connection comprise the step of connecting together the selected transistors in the first and third arrays.

5. The method of claim 3 wherein the steps overlaying a second connection and overlaying a sixth connection comprise the step of connecting together the selected transistors in the second and fourth arrays.

6. The method of claim 3 wherein the transistors in said third array are of a first size and wherein the transistors in said fourth array are of a second size.

7. The method of claim 3 wherein the step of overlaying a first connection comprises the step of overlaying a layer of polysilicon.

8. The method of claim 1 wherein the transistors in said first array are of a first size and wherein the transistors in said second array are of a second size.

9. The method of claim 1 wherein the step of overlaying a first connection comprises the step of overlaying a layer of polysilicon.

* * * * *